(12) United States Patent
Rosselli et al.

(10) Patent No.: US 9,634,669 B2
(45) Date of Patent: Apr. 25, 2017

(54) RECONFIGURABLE SYSTEM-ON-CHIP AND RELATED METHODS

(71) Applicant: STMICROELECTRONICS S.R.L., Agrate Brianza (IT)

(72) Inventors: Salvatore Marco Rosselli, Catania (IT); Daniele Mangano, San Gregorio di Catania (IT); Riccardo Condorelli, Tremestieri Etneo/Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/971,150

(22) Filed: Dec. 16, 2015

(65) Prior Publication Data
US 2016/0352337 A1    Dec. 1, 2016

(30) Foreign Application Priority Data
May 25, 2015   (IT) .................. 102015000017584

(51) Int. Cl.
*H03K 19/177*  (2006.01)
*G06F 15/78*   (2006.01)
*H03K 19/00*   (2006.01)

(52) U.S. Cl.
CPC ..... *H03K 19/1776* (2013.01); *G06F 15/7867* (2013.01); *H03K 19/0008* (2013.01); *G06F 2209/507* (2013.01)

(58) Field of Classification Search
CPC .................. H03K 19/1776; H03K 19/0008
USPC ................................ 326/38, 40, 46
See application file for complete search history.

(56) References Cited

U.S. PATENT DOCUMENTS

| | | | |
|---|---|---|---|
| 6,392,438 B1 * | 5/2002 | Cliff .................. | H03K 19/1736 326/39 |
| 6,467,009 B1 | 10/2002 | Winegarden et al. | |
| 6,732,068 B2 * | 5/2004 | Sample .............. | G01R 31/2853 326/40 |
| 2002/0130681 A1 * | 9/2002 | Cliff .................. | G11C 8/12 326/41 |
| 2005/0097499 A1 * | 5/2005 | Sun .................... | G06F 15/7867 326/38 |
| 2005/0108495 A1 | 5/2005 | McKenney et al. | |
| 2005/0248366 A1 * | 11/2005 | Chung .............. | G06F 17/5045 326/41 |

OTHER PUBLICATIONS

Marshall et al.—A Reconfigurable Arithmetic Array for Multimedia Applications, ACM/SIGDA International Symposium on Field Programmable Gate Arrays, FPGA '99, Monterey, CA Feb. 21-23, 1999, pp. 135-143.

* cited by examiner

*Primary Examiner* — Daniel D Chang
(74) *Attorney, Agent, or Firm* — Slater Matsil, LLP

(57) ABSTRACT

A circuit includes combinational circuit and sequential circuit elements coupled thereto. The circuit includes a multiplexor coupled to the combinational and sequential circuit elements, and a system register is coupled to the multiplexor. At least one portion of the combinational and sequential circuit elements is configured to selectively switch to operate as a random access memory.

18 Claims, 5 Drawing Sheets

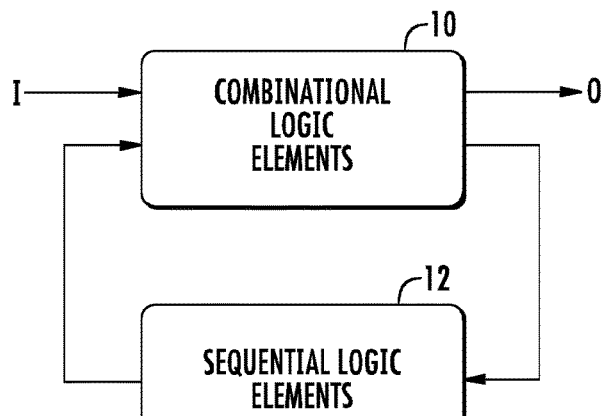
FIG. 1
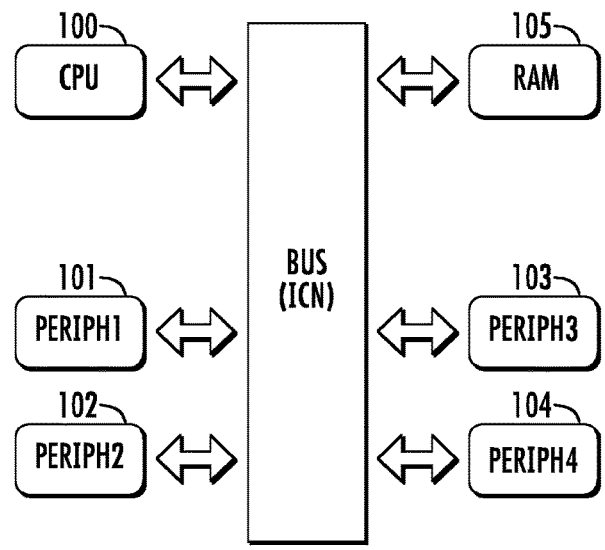
FIG. 2
FIG. 3

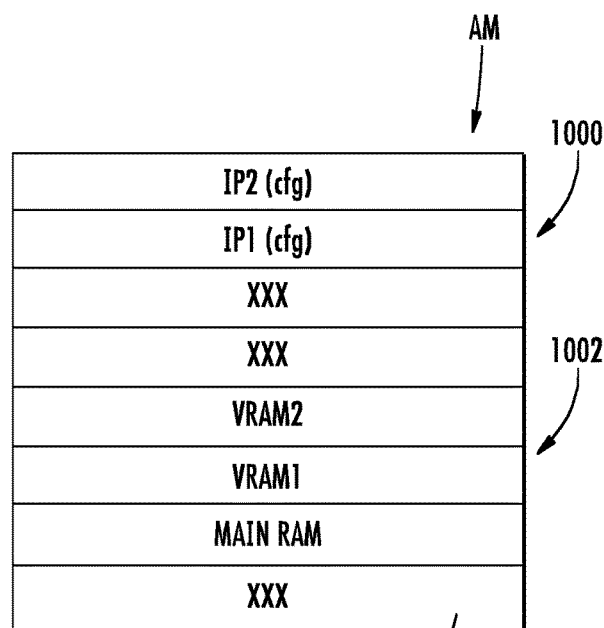
FIG. 10
FIG. 11
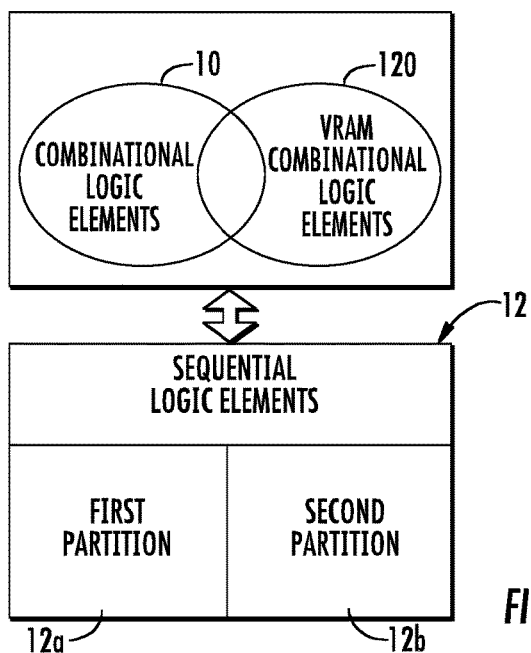
FIG. 12

RECONFIGURABLE SYSTEM-ON-CHIP AND RELATED METHODS

TECHNICAL FIELD

The present disclosure relates to the field of integrated circuits, and, more particularly, to a reconfigurable System-on-Chip (SoC), and related methods.

BACKGROUND

Microelectronic products, such as SoC products, may include digital intellectual property (IP) units that serve a wide spectrum of applications. A differentiating factor between similar products is the efficiency of using the silicon area dedicated to the digital circuits.

SUMMARY

One or more embodiments may include a reconfigurable digital unit (e.g., a digital circuit), a corresponding reconfigurable apparatus (e.g., a System-on-Chip or SoC product such as a microcontroller), a method of operating a reconfigurable digital circuit, and a computer program product loadable in a memory of at least one computer and including software code portions to run on the at least one computer. As used herein, reference to a computer program product is understood as a reference to a computer-readable means containing instructions for controlling a processing system. Reference to "at least one computer" is intended to highlight the possibility for one or more embodiments to be implemented in modular and/or distributed form.

One or more embodiments may include sequential logic available in digital circuits where their basic functionality is not otherwise exploited.

One or more embodiments may provide a reconfigurable system of a group of digital IP blocks by switching the digital IP blocks to user-accessible memory locations (e.g., RAMs).

One or more embodiments may provide flexibility of system architectures, e.g., at the design and prototyping stages.

One or more embodiments may be applied, e.g., to SoC products including RAM memories.

One or more embodiments may be suitable for systems with embedded cores, interconnect-based communication and a relatively large amount of digital peripherals, where a microcontroller unit is an example of such a system.

One or more embodiments may be applied to general purpose platforms with application scenarios, which may vary, while providing the possibility of using the benefit of one or more embodiments.

One or more embodiments may be used for digital IP debug purposes, e.g., to debug peripherals. For example, when a digital IP unit may be "suspected" of incorrect behavior during a prototyping phase, one or more embodiments may permit to switch operation to a virtual RAM mode thus making it possible to read the current (possibly defective) state as this is still stored in the sequential elements and thus accessible, e.g., via software.

One or more embodiments may be beneficial in increasing the speed of the design phase of derivative products (e.g., derivative microcontroller units with different memory sizing and reduced/extended set of peripherals) by statically switching unused peripherals to operate as memories (e.g., to extend the system RAMs). This makes it possible to reduce the time-to-market of derivative products of general-purpose platforms.

One or more embodiments may retain the working state of a digital IP unit in a system placed in a low-power state by using a word-based interface.

BRIEF DESCRIPTION OF THE DRAWINGS

One or more embodiments will now be described, by way of non-limiting example only, with reference to the annexed figures, in which:

FIG. 1 is a block diagram representative of a digital circuit of embodiments of the invention;

FIG. 2 represents a system representative of embodiments of the invention;

FIG. 3 is an example of an address map in accordance with embodiments of the system of FIG. 2;

FIG. 10 is an exemplary arrangement of an address map for peripherals in accordance with embodiments of the invention;

FIG. 11 is an exemplary arrangement of an address map in accordance with embodiments of the invention; and FIG. 12 is a block diagram of reconfiguration of circuit elements in one or more embodiments of the invention.

DETAILED DESCRIPTION

Figure 4:
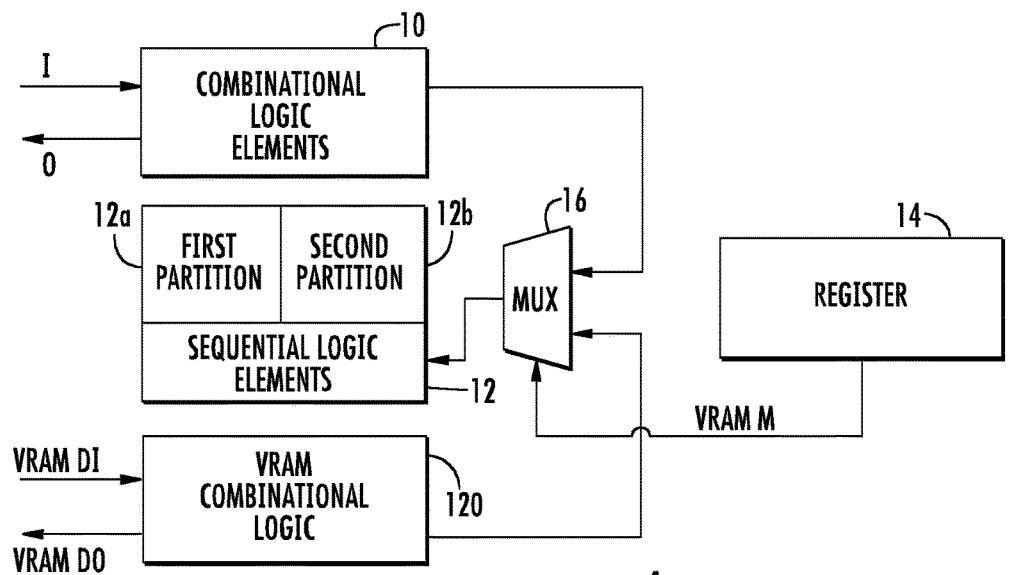
FIG. 4 schematically represents the digital circuit of FIG. 1 according to embodiments of the invention.

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

The block diagram of FIG. 1 is generally exemplary of the possibility of representing a digital unit (e.g., a digital circuit) receiving input signals I and issuing output signals O as a network arrangement of combinational logic elements 10 and sequential logic elements 12.

The sequential elements 12 (e.g., edge-triggered D flip-flops) may store states of the digital circuit and may be reset before the system or a certain functionality thereof is started.

When a certain component in the circuit is not used, the values stored by the sequential logic 12 become irrelevant and may be assumed to correspond to the reset states.

FIG. 2 is an exemplary representation at a system level of such a circuit, which may include, e.g., a Central Processing Unit or CPU 100, a set of peripherals 101, 102, 103, 104, . . . and one (or more) Random Access Memories or RAMs 105 connected via a bus/InterConnect Network (ICN) 106.

Those of skill in the art will appreciate that the representation of FIG. 2 is purely exemplary of a variety of possible arrangements where any of the elements shown may be missing (or substituted by other elements) and/or additional elements may be present.

At the system level, the digital blocks exemplified in FIG. 2 may be reached by software at respective addresses such as, e.g., Periph 1, Periph 2, Periph 3, RAM . . . for the elements 101, 102, 103 . . ., 105, respectively. A corresponding address map AM as represented, purely by way of example, in FIG. 3.

In one or more embodiments as schematically represented in FIG. 4, a software-accessible register 14 (system configurator) may be added to the layout of FIG. 1. By setting the register 14, one or more digital blocks may be switched to a virtual RAM (VRAM) mode.

In one or more embodiments, a system may thus include an IP block where a set of IP registers (e.g., the sequential logic 12) may include, possibly together with other partitions: a first partition 12a including registers which may be configured in a VRAM mode; and a second partition 12b including other registers that, for any reason, may not be held to be suitable for being configured in a VRAM mode.

A purpose of the VRAM mode may be to reconfigure the IP internal registers in a way that they become accessible at a system level essentially as a RAM (as shown in FIG. 2).

In one or more embodiments such an approach may involve creating (possibly by re-using a portion of the logic 10—see FIG. 12) a VRAM combinational logic 120 for supporting such a new configuration.

The system (IP block) may thus operate in two (e.g. mutually exclusive) modes: a "conventional" IP mode, and a VRAM mode.

At a system level, the configuration register 14 may be added (which may be both external to the IP block or included among the IP block registers) in order to enable/disable the VRAM mode, e.g., via software.

When in such a VRAM mode, the sequential elements in the digital IPs 12a may then act as a memory accessible, e.g., via the interconnect 106 within a certain address space (e.g., the same address as the original peripheral, possibly by remapping/expanding the address space as detailed in the following) with the capability of receiving "VRAM" inputs, e.g., input data VRAM DI and issuing corresponding "VRAM" outputs, e.g., output data VRAM DO.

Reference number 16 in FIG. 4 denotes a MUX module, which may be controlled via a VRAM mode signal VRAM M from the register 14 with the capability of co-operating with the combinational logic elements 10 and sequential logic elements 12 to switch the system to the VRAM mode.

In one or more embodiments, these two modes may be mutually exclusive and the MUX module 16 (including e.g., a MUX for each register) may keep the two modes (standard IP and VRAM) separate so that the sequential block 12 may receive: the value produced by the logic 10 in a conventional functional mode, or, alternatively, the value from the logic 120.

Figure 5:
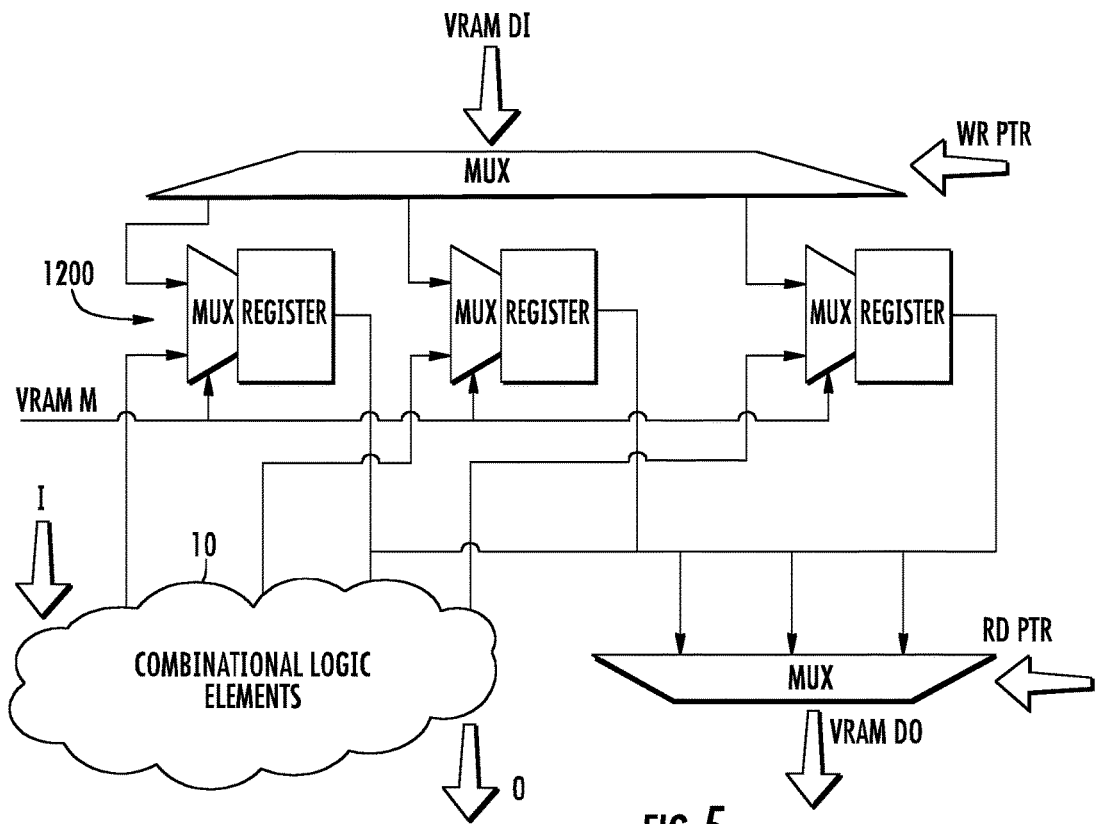
FIG. 5 schematically represents the digital circuit configured in a virtual RAM (VRAM) operational mode.

As schematically represented in FIG. 5, switching to a VRAM operation mode may not affect operation of the combinational logic 10 per se in receiving the input signals I and issuing the output signals O, except that the availability of the combinational logic elements 120 switched to the VRAM mode may be exploited.

In fact, the logic 10 may be unmodified, while however, with the "functional" conventional IP mode and the VRAM mode being mutually exclusive, the functional output provided when in the VRAM mode may be meaningless (e.g. ignored, blocked or kept at a known value) since the registers are "captured" by the other combinational logic.

In one or more embodiments may thus involve providing one or more of: some combinational logic 120, e.g., in order to access and re-organize the sequential elements as words; read/write pointers RD PTR/WR PTR; and decoding logic for the "virtual" RAM.

In that way, respective input data VRAM DI may be received and respective output data VRAM DO issued by the combinational logic elements 120 when switched to the VRAM mode.

Reference number 1200 in FIG. 5 is indicative of elements such as e.g., D Flip-Flops (DFFs) which may represent an implementation of a MUX 16 and the registers 12a of FIG. 4.

Figure 6:
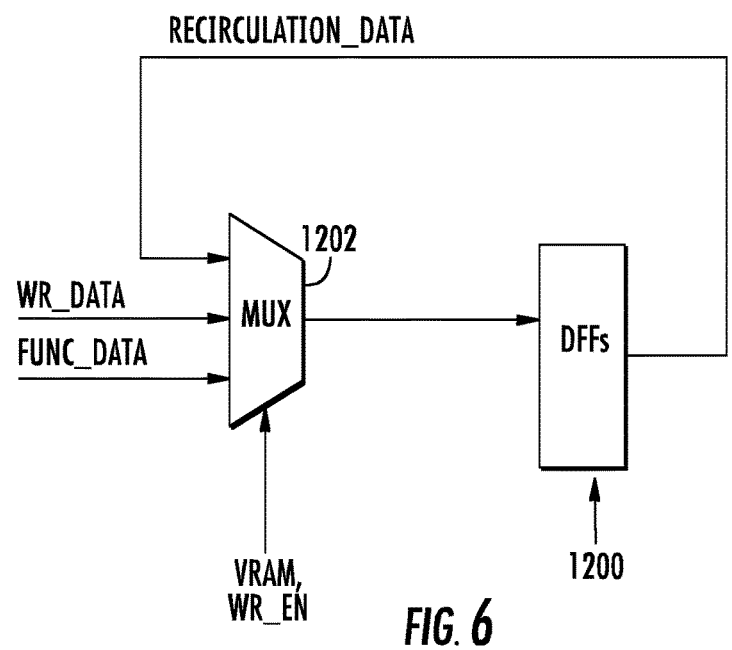
FIG. 6 schematically represents the digital circuit configured in a writing mode of embodiments of the invention.
Figure 7:
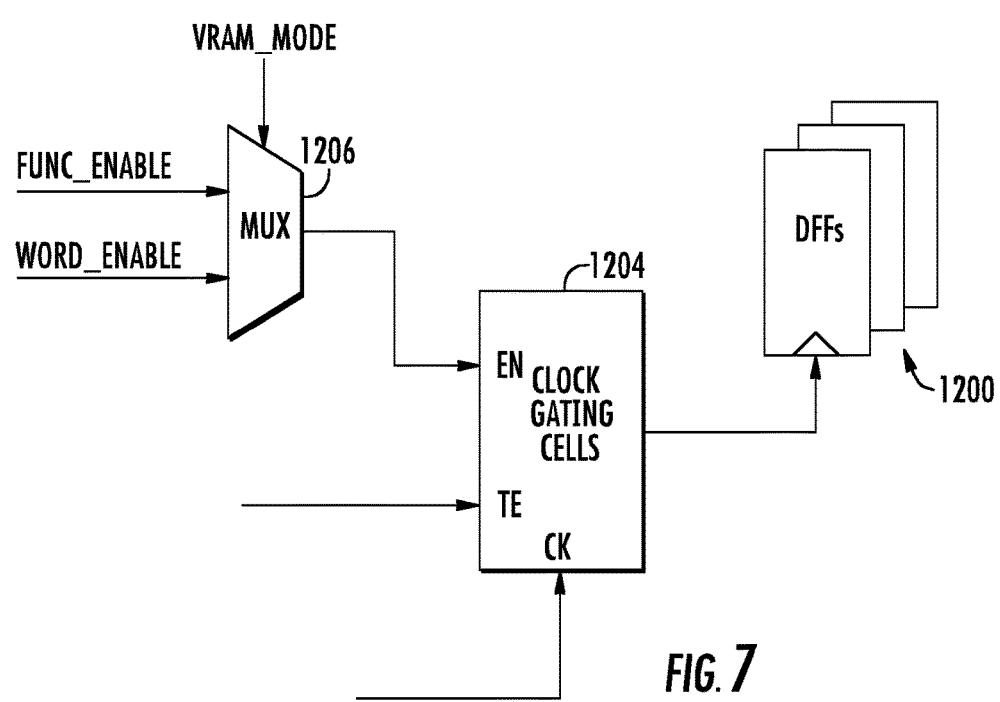
FIG. 7 schematically represents the digital circuit configured in a recirculation mode of embodiments of the invention.

FIGS. 6 and 7 are exemplary block diagrams of possible approaches in managing the VRAM elements such as the DFFs 1200.

For instance, the block diagram of FIG. 6 is exemplary of a simple topology, wherein for each memory word the decoding logic relies on a multiplexer-based structure, e.g., with a writing logic including a 3×1 input multiplexer 1202 driven by selection signals VRAM, WR_EN (as possibly issued from the register 14).

In one or more embodiments, the values of these two selection signals may produce any of the three following modes of operation:

i) standard functional input data funs_data are taken when in the standard IP mode;

ii) the data stored in the DFF 1200 are recirculated as recirculation_data, when in the VRAM mode with the DFF 1200 not selected for write operation; and iii) new memory data are selected when, in the VRAM mode, the DFF 1200 is selected for a write operation wr_data.

The logic involved in the VRAM mode may be described at a RTL-level (together with the digital IP) or can be added at a netlist level. For instance, a basic netlist implementation flow may collect topologically-close word-sized groups of DFFs and replace a standard cell with a custom element including the 3×1 multiplexer, essentially as a scan insertion mechanism.

The block diagram of FIG. 7 is exemplary of a possible per-word arrangement of the memory function (e.g. 32-bit structures for the DFFs 1200) which may permit to implement the three modes of operation i), ii), and iii) considered in the foregoing with less area overhead.

For instance, the diagram of FIG. 7 is representative of possible recirculation of a 32-bit memory word applied with a clock gating cell (e.g., a flip-flop 1204). In that way, a 2×1 MUX 1206 may be used to manage e.g., a write operation with each flop having two inputs func_enable and word_enable and a control signal VRAM_MODE (e.g., from the register 14).

It will be appreciated that, in one or more embodiments, the MUX 1206, which makes it possible to implement recirculation of e.g., a 32-bit word, may not be completely alternative to the MUX 1202 associated with each DFF, but rather adds thereto. The presence of the MUX 1206 and the clock gating mechanism makes it otherwise possible for each 3×1 MUX 1202 in FIG. 6 to be replaced by a 2×1 MUX controlled by the VRAM signal only. In one or more embodiments, the signal word_enable of FIG. 7 may correspond to the signal WR_EN in FIG. 6, since the word is accessed as whole, the signal word_enable may correspond to e.g., 32 WR_EN signals controlled simultaneously with a single bit.

In that way, both recirculation and writing of data are manageable (word_enable) as an alternative to IP operation as sequential elements (func_enable).

An implementation relying on such an approach may take advantage of the possibility of sharing similar functional logic (IP mode), which may already be present. In one or more embodiments, clock gating cells may be common, especially in low power designs. The digital unit may then be likely to have several of these already present in its functional (IP mode) implementation which may be used in the VRAM mode with low extra logic requirements.

In one or more embodiments, common digital structures such as register banks, FIFOs and soft memories may be exploited by, turning them into virtual RAMS with a reduced silicon area overhead. In one or more embodiments, the VRAM mode may extensively re-use configuration registers which are addressable by construction.

Figure 8:
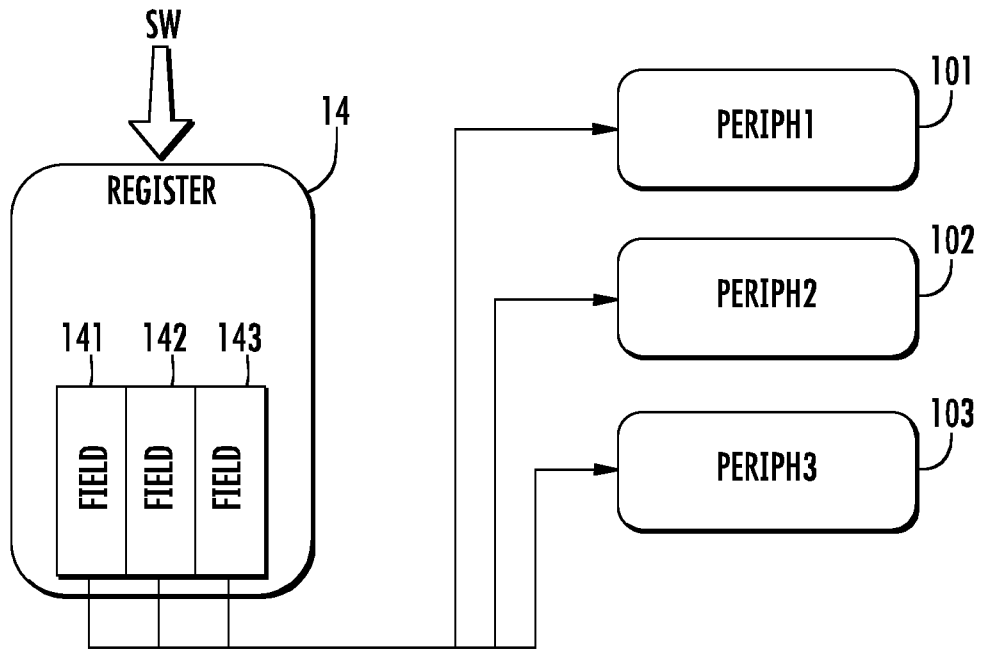
FIG. 8 is a functional block diagram exemplary of an operation of embodiments of the invention.

The diagram of FIG. 8 is a system-level representation of one or more embodiments from a user viewpoint. The diagram of FIG. 8 exemplifies one or more software-controllable system register(s) 14 including sets of fields, e.g., 141, 142, 143 . . . for respective peripherals (or groups of aggregated peripherals) 101, 102, 103, . . . which may be selectively switched into the VRAM mode e.g. via software SW.

Figure 9:
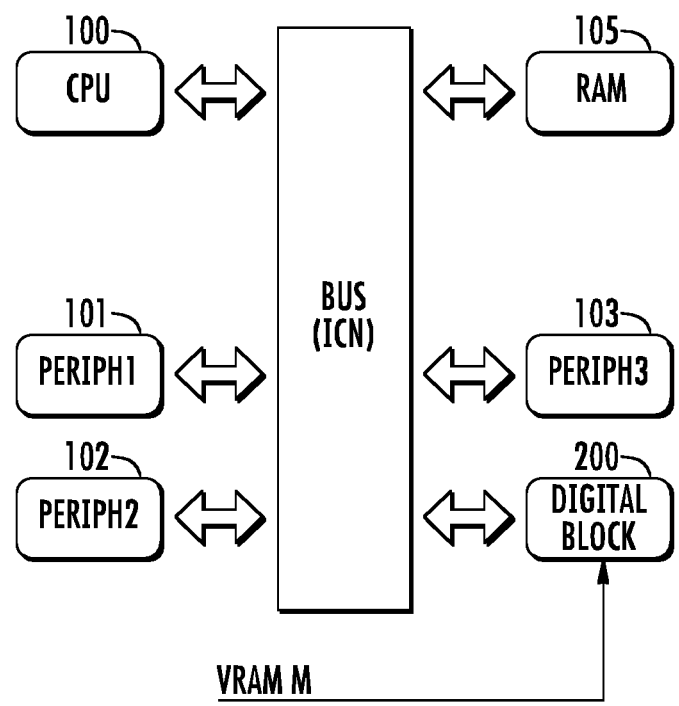
FIG. 9 is a system block diagram of one or more embodiments of the invention.

The block diagram of FIG. 9 shows, by way of direct reference to the block diagram of FIG. 2, the possibility for digital blocks (generally indicated as 200) which are not used in the application scenario to be selected through the fields of the system register 14 by changing the corresponding address map AM from the "standard" format of FIG. 10 to the layout schematically shown in FIG. 11.

While the map of FIG. 10 can be seen as essentially corresponding to the map of FIG. 3, these maps may not be identical insofar as the map in FIG. 3 represents the basic operation in the conventional IP mode, without the provision for possible VRAM mode activation.

With the VRAM mode activated, the address map may be reconfigured (in a more common case, it will have to) to receive the new RAM seen by the software as a substitute, extension or (full) repositioning.

One may consider FIG. 11 as an example. This shows configuration registers 1000 e.g., IP1 (cfg), IP2 (cfg), which may be accessible in the IP mode only, along with configuration registers 1002 VRAM1, VRAM2,. . . which may become part of the virtual RAM together with other flip-flops in IP1 and IP2 thus extending e.g., the capability of the main RAM 12A in the standard IP mode by means of an "extension" in the VRAM mode produced by the virtual registers VRAM1, VRAM2.

Stated otherwise, 121 and 122 are (in the IP mode) at the addresses shown in the upper part of the map. When the VRAM mode is activated, the spaces denoted IP1 and IP2 may no longer be accessible by software, while the portions VRAM1 and VRAM2 (which are "prohibited" in the IP mode) now become accessible. In the example given, the portions VRAM1 and VRAM2 are contiguous to the Main RAM, and the new address map gives to software a single "large" RAM.

From a system perspective, the software SW can either see a certain RAM at the same address of the original peripheral or at an extension to one of the system RAMs (e.g., through address remapping).

In one or more embodiments, when in the virtual RAM mode a (significant) part of the original interface can be re-used e.g., protocol state machines to communicate over the interconnect 106.

In that respect, FIG. 12 (essentially to be seen in connection with FIG. 4) shows that, while representing a sort of implementation overhead, the combinational logic 120 for the VRAM mode may re-use certain portions of the combinational logic 10 of the IP mode.

FIG. 12 depicts the logics 10 and 120 as partially superposed, while the registers 12a and 12b are depicted as distinct partitions in that e.g., each flip-flop (e.g., DFF) may be or not be part of the VRAM mode.

Efficiency in implementation will aim at increasing the intersection of the logics 10 and 120 (increasing as much as possible the portion of the logic 10 which is re-used to create the logic 120) and reducing the partition 12b to the benefit of the partition 12a (by exploiting as many registers as possible in a VRAM mode).

In one or more embodiments some logic may be devoted to extend the allowed address space. For example, in the IP mode, configuration registers may only be accessed via software SW, while additional flip-flops may be included in the addressable region in the VRAM mode. Address decoders throughout the interconnect 106 may support a remapping function, if present.

Without prejudice to the underlying principles, the details and embodiments may vary, even significantly, with respect to what has been described by way of example only, without departing from the extent of protection. The extent of protection is defined by the annexed claims.

The invention claimed is:

1. A method of operating a reconfigurable digital circuit comprising combinational and sequential circuit elements, the method comprising:
   selectively switching at least one portion of the sequential circuit elements to operate as random access memory within an address space;
   remapping the address space to receive a virtual random access memory (VRAM) input when the at least one portion of the sequential circuit elements is switched to operate as the random access memory;
   receiving the VRAM input at a VRAM combinational logic circuit; and
   transmitting the VRAM input from the VRAM combinational logic circuit to the sequential circuit elements.

2. The method of claim 1, wherein the digital circuit further comprises an interconnect element, and further comprising making the at least one portion of the sequential circuit elements accessible using the interconnect element.

3. The method of claim 1, further comprising configuring the at least one portion of the sequential circuit elements as word-based logic elements.

4. The method of claim 1, wherein selectively switching the at least one portion of the sequential circuit elements comprises configuring the circuit elements to operate in at least one operational state comprising:
- operating as sequential circuit elements;
- recirculating data stored therein; and
- writing new data therein.

5. The method of claim 4, wherein recirculating comprises using a clock gating cell, and wherein the recirculating and the writing are alternatives to operating as sequential circuit elements.

6. The method of claim 5, wherein the digital circuit comprises a main random access memory, and the at least one portion of the sequential circuit elements are added to the main random access memory using address remapping.

7. A circuit comprising:
- a plurality of combinational circuit elements;
- a plurality of sequential circuit elements coupled to the plurality of combinational circuit elements;
- a multiplexer coupled to the pluralities of combinational and sequential circuit elements;
- a system register coupled to the multiplexer and configured to remap an address space to receive a virtual random access memory (VRAM) input when at least one portion of the sequential circuit elements is switched to operate as random access memory within the address space; and
- a VRAM combinational logic circuit coupled to the multiplexer and configured to transmit the VRAM input to the sequential circuit elements.

8. The circuit of claim 7, comprising an interconnect element configured to access the at least one portion of the sequential circuit elements switched to operate as random access memory.

9. The circuit of claim 7, wherein the at least one portion of the sequential circuit elements switched to operate as random access memory is configured as word-based logic elements.

10. The circuit of claim 7, further comprising a clock gating cell coupled to the multiplexer and configured to manage a write operation of data to the at least one portion of the sequential circuit elements switched to operate as random access memory.

11. The circuit of claim 7, wherein the digital circuit comprises a main random access memory, and the at least one portion of the sequential circuit elements switched to operate as random access memory is configured to be added to the main random access memory using address remapping.

12. An apparatus comprising:
a digital circuit comprising
- a plurality of combinational circuit elements,
- a plurality of sequential circuit elements coupled to the plurality of combinational circuit elements,
- a multiplexer coupled to the pluralities of combinational and sequential circuit elements,
- a system register coupled to the multiplexer and configured to remap address space to receive a virtual random access memory (VRAM) input when at least one portion of the plurality of sequential circuit elements is switched to operate as random access memory within the address space, and
- a VRAM combinational logic circuit coupled to the multiplexer and configured to transmit the VRAM input to the sequential circuit elements.

13. The apparatus of claim 12, wherein the apparatus comprises a microcontroller.

14. The apparatus of claim 12, wherein the apparatus comprises a System-on-Chip.

15. The apparatus of claim 12, comprising an interconnect element configured to access the at least one portion of the sequential circuit elements switched to operate as random access memory.

16. The apparatus of claim 12, wherein the at least one portion of the sequential circuit elements switched to operate as random access memory being configured as word-based logic elements.

17. The apparatus of claim 12, further comprising a clock gating cell coupled to the multiplexer and configured to manage a write operation of data to the at least one portion of the sequential circuit elements switched to operate as random access memory.

18. A non-transitory computer-readable medium storing instructions that, when executed, cause a computing device to:
- selectively switch at least one portion of sequential circuit elements to operate as random access memory within an address space;
- remapping the address space to receive a virtual random access memory (VRAM) input when the at least one portion of the sequential circuit elements is switched to operate as the random access memory;
- receiving the VRAM input at a VRAM combinational logic circuit; and
- transmitting the VRAM input from the VRAM combinational logic circuit to the sequential circuit elements.

* * * * *